United States Patent [19]

Morikawa et al.

[11] Patent Number: 5,261,950
[45] Date of Patent: Nov. 16, 1993

[54] COMPOSITION FOR METALIZING CERAMICS

[75] Inventors: Asao Morikawa, Komaki; Kazunori Miura; Kazuo Kondo, both of Nagoya, all of Japan

[73] Assignee: NGK Spark Plug Co., Ltd., Aichi, Japan

[21] Appl. No.: 903,933

[22] Filed: Jun. 26, 1992

[30] Foreign Application Priority Data

Jun. 26, 1991 [JP] Japan .................. 3-154960

[51] Int. Cl.$^5$ .................. C04B 41/88; H01B 1/02; H01B 1/08
[52] U.S. Cl. .................. 106/1.13; 106/1.18; 106/1.23; 106/1.14; 501/15; 501/17; 501/32; 252/512; 252/518
[58] Field of Search .................. 106/1.13, 1.14, 1.18, 106/1.23; 501/15, 17, 32; 252/512, 518, 521

[56] References Cited

U.S. PATENT DOCUMENTS

| | | | |
|---|---|---|---|
| 4,687,597 | 8/1987 | Siuta | 252/512 |
| 4,748,085 | 5/1988 | Fukuda et al. | 428/432 |
| 4,906,596 | 3/1990 | Joslin et al. | 501/17 |
| 5,011,530 | 4/1991 | Kondo et al. | 106/1.13 |
| 5,035,837 | 7/1991 | Saeki et al. | 252/512 |

FOREIGN PATENT DOCUMENTS

| | | |
|---|---|---|
| 62-198198 | 9/1987 | Japan . |
| 62-205692 | 9/1987 | Japan . |
| 62-232191 | 10/1987 | Japan . |
| 63-233090 | 9/1988 | Japan . |
| 1-231398 | 9/1989 | Japan . |
| 63-236784 | 10/1989 | Japan . |
| 1-321691 | 12/1989 | Japan . |
| 1-321692 | 12/1989 | Japan . |
| 2-33806 | 2/1990 | Japan . |
| 2-33807 | 2/1990 | Japan . |
| 2-267990 | 11/1990 | Japan . |

*Primary Examiner*—Mark L. Bell
*Assistant Examiner*—Margaret Einsmann
*Attorney, Agent, or Firm*—Sughrue, Mion, Zinn, Macpeak & Seas

[57] ABSTRACT

A composition for metalizing low temperature-fired ceramics according to the invention includes: a combination of two or three oxides selected from the group consisting of 1 to 8 percent by weight of bismuth(III) oxide ($Bi_2O_3$), 0.1 to 5 percent by weight of $MoO_3$, and 0.1 to 2 percent by weight of $Cr_2O_3$ as well as a primary constituent, that is, mixture of copper (Cu) and copper-(II) oxide (CuO) or mixture of copper(II) oxide (CuO) and copper(I) oxide ($Cu_2O$). The additives of the invention efficiently keep the resultant metalized layer out of cracks and prevent local sintering and burr of the metalized layer.

24 Claims, 4 Drawing Sheets

COMPOSITION FOR METALIZING CERAMICS

BACKGROUND OF THE INVENTION

The present invention relates to a composition for metalizing ceramics, and more specifically to a composition of metal surface laid over low temperature-fired ceramics which is applicable to high density multi-layered wiring substrates, integrated circuits, transistor packages, and electrically insulated electronic parts.

A composition for metalizing low temperature-fired ceramics is fired simultaneously with the ceramics to form a metal surface thereon. Various compositions and conditions have been proposed for metalizing low temperature-fired ceramics. An example is disclosed in Japanese Unexamined Patent Application No. 63-295491, which varies the mixing ratio and grain size of CuO (copper(II) oxide) and Cu (copper) powdery mixture and adds $TiO_2$ (titanium(IV) oxide), $MnO_2$ (manganese(IV) oxide), Pt (platinum), Au (gold), or $Ag_2O$ (silver(I) oxide) to the mixture to improve the conductivity, the hermeticity, and other properties of Cu-metalized layers.

A Cu-metalized layer is formed on ceramics through simultaneous firing of a Cu composition with the ceramics typically according to the following steps: (1) removing a binder in the atmosphere (binder removal step); (2) reducing CuO to Cu in $H_2$ gas or decomposition gas (reduction firing step); (3) sintering and uniting ceramics and Cu in non-oxidation gas (final firing step).

The conventional method requires the above steps for depositing the metalized layer on ceramics and may thus have problems mentioned below.

Figure 4:
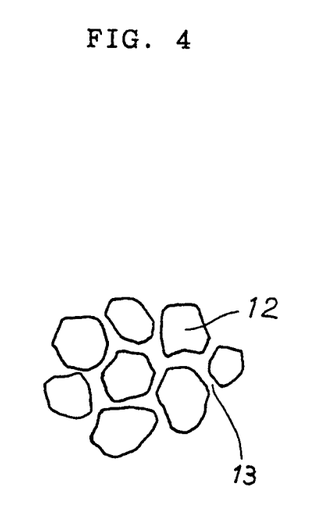
FIG. 4 is an explanatory view showing a problem of the prior art.

In steps (1) and (2) of this process, unavoidable oxidation or reduction of copper powder results in variation of the total volume: increase by oxidation and decrease by reduction. The volume variation may cause uneven density in the metalized layer and generate honeycombed cracks 13 around the thinly layered region, and divide the layer into several blocks 12 as shown in FIG. 4. In such a case, the blocks 12 are not uniformly but locally sintered in the subsequent step (3) and worsen the conductivity or hermeticity of the metalized layer.

The mixing ratio of copper to copper oxide in the primary composition of the metalized layer is heightened for enhanced hermeticity. The higher copper ratio in the composition, however, causes large variation of volume due to oxidation of copper to copper oxide in the binder removal step (1), which results in burr of the metalized layer from the ceramic base.

SUMMARY OF THE INVENTION

The general object of the invention is thus to provide a composition for depositing a metalized layer on ceramics with excellent properties.

A specific object of the invention is to prevent undesirable burr of the metalized layer without increasing the mixing ratio of copper in the composition.

Another specific object of the invention is to prevent the metalized layer from being locally sintered.

The above and other related objects are realized by using a composition for metalizing low temperature-fired ceramics, in which either 0.1 through 5 percent by weight of molybdenum(VI) oxide ($MoO_3$) or 0.1 through 2 percent by weight of chromium(III) oxide ($Cr_2O_3$) is added to a primary constituent, that is, a mixture of copper (Cu) and copper(II) oxide (CuO) or mixture of copper(II) oxide (CuO) and copper(I) oxide ($Cu_2O$).

In another feature of the invention, a combination including at least two oxides selected from the group consisting of 1 to 8 percent by weight of bismuth(III) oxide ($Bi_2O_3$), 0.1 to 5 percent by weight of $MoO_3$, and 0.1 to 2 percent by weight of $Cr_2O_3$ is added to a primary constituent, that is, mixture of copper (Cu) and copper(II) oxide (CuO) or mixture of copper(II) oxide (CuO) and copper(I) oxide ($Cu_2O$).

In the composition for metalizing low temperature-fired ceramics, 0.1 to 0.5 percent by weight of silver (Ag) and/or 1 to 10 percent by weight of glass may further be added to the primary mixture.

The CuO-Cu mixture preferably includes thirty to a hundred parts by weight of copper (II) oxide powder and seventy to zero parts by weight of copper powder, while the CuO-$Cu_2O$ mixture has ten to a hundred parts by weight of copper (II) oxide and ninety to zero parts by weight of copper (I) oxide.

The preferable range of the grain size is: 0.5 through 5 micrometers in diameter for copper (II) oxide; 0.5 through 10 micrometers for copper (I) oxide; and 0.5 through 20 micrometer for copper powder. Within the respective range, powder of different average grain sizes may be combined and used together.

Bismuth(III) oxide has insufficient effect on prevention of local sintering of the metalized layer in concentrations less than 1 percent by weight, and gives too much conduction resistance in concentrations greater than 8 percent by weight. The favorable range of grain size is 0.3 to 1.0 micrometers in diameter for $Bi_2O_3$.

Molybdenum (VI) oxide does not have a favorable effect on prevention of local sintering of the metalized layer in concentrations less than 0.1 percent by weight, and discolors ceramics to black in concentrations greater than 5 percent by weight. The favorable range of grain size is 3 to 5 micrometers in diameter for $MoO_3$.

Chromium (III) oxide does not favorably effect prevention of local sintering of the metalized layer in concentration less than 0.1 percent by weight, and lowers the hermeticity of the metalized layer in concentrations greater than 2 percent by weight. The favorable range of grain size is 0.3 to 1.0 micrometer in diameter for $Cr_2O_3$.

The composition of the invention for metalizing ceramics includes $Bi_2O_3$, $MoO_3$, and/or $Cr_2O_3$. These additives prevent the undesirable local sintering of the metalized layer.

A ceramic green sheet with a metalizing paste printed thereon is fired in the atmosphere for removal of a binder. Copper is oxidized to copper (II) oxide and increases the volume in the binder removal step. Copper (II) oxide is again reduced to copper and decreases the volume in the subsequent reduction firing step. This variation in volume results in non-uniform density of the metalized layer and causes propagation of cracks.

In the reduction firing step, $Bi_2O_3$ in the composition is also reduced to bismuth, which dampens copper particles to make the particles combine with each other. The copper particles bound with bismuth prevent further extension of cracks.

$MoO_3$ is also reduced to molybdenum, which has a higher melting point of 2,622° C. and does not wet copper particles, but interposes between the copper particles to prevent local sintering thereof. It efficiently prevents occurrence of cracks in the reduction firing step. In the final firing step, molybdenum is alloyed with copper to form a densely packed metalized layer. Since the ceramic base is also sintered in the final firing step, cracks do not occur in the metalized layer.

$Cr_2O_3$ is not reduced but interposes between the copper particles in the same manner as molybdenum to prevent local sintering of the copper particles. In the final firing step, $Cr_2O_3$ particles diffuse in the interface between the ceramic base and the metalized layer to enhance adhesion strength therebetween.

The composition of the invention effectively prevents occurrence of undesirable cracks or separation into blocks, thus maintaining favorable conductivity and hermeticity and preventing burring of the metalized layer. The combination of two or more additives is especially favorable since it effectively prevents occurrence of cracks and realizes a more densely packed metalized layer.

The functions of silver and glass, which may be added to the composition, are described briefly.

Silver of not less than 0.1 percent by weight forms an alloy with copper and contributes to the higher density of the metalized layer. Addition of the excessive amount, that is, more than 0.5 percent by weight, however, causes fusion of the copper-silver alloy to form alloy balls.

Addition of glass in a range of not less than 1 percent by weight and not greater than 10 percent by weight results in a strong binding between the ceramic base and copper and contributes to the enhanced hermeticity and adhesion strength. Glass powder interposes between the copper particles and prevents occurrence of cracks in the reduction firing steps. Favorable examples of such glass include crystallized glass powder such as cordierite as the primary crystal and powder containing $TiO_2$ (titanium (II) oxide), $SiO_2$ (silicon dioxide), or $Al_2O_3$ (aluminum oxide).

The above and further objects and features of the invention will more fully be apparent from the following detailed description with accompanying drawings.

DESCRIPTION OF THE PREFERRED EMBODIMENT

Figure 1:
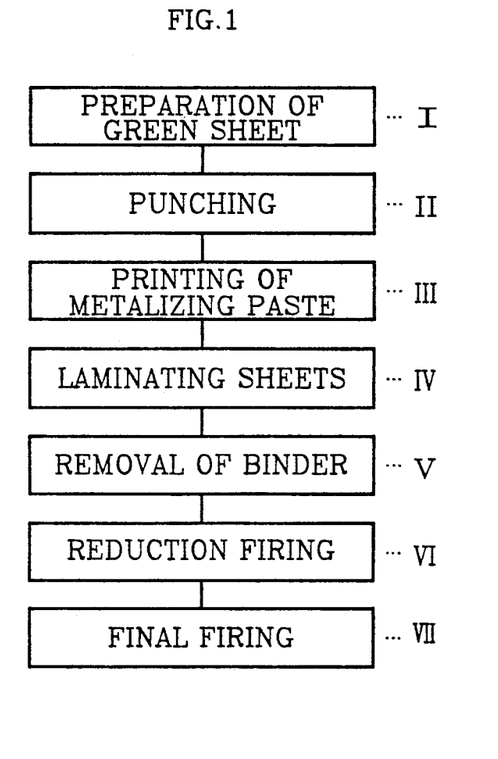
FIG. 1 is a diagram showing steps of forming a metalized layer on ceramics according to the invention.

A preferred embodiment of the invention, a ceramic package, is manufactured according to the steps of FIG. 1.

Step I: Preparation of Green Sheet

Predetermined amounts of ZnO, $MgCO_3$, $Al(OH)_3$, $SiO_2$, $H_3BO_3$, and $H_3PO_4$ are weighed as materials of a green sheet, mixed with a mixer, and fused in a platinum or alumina crucible at a suitable temperature between 1,400° C. and 1,500° C. The molten salt is dropped in water to be rapidly cooled, forms a vitreous structure, and is crushed to frit or glass powder of two to three micrometers in average diameter with an alumina ball mill.

The glass powder is mixed with poly(vinyl butyral) and a plasticizer, for example, diethylene glycol, and a green sheet of approximately 0.6 mm in thickness is prepared by the doctor blade method.

Step II: Punching

The green sheet thus prepared is punched when required.

Step III: Printing of Metalizing Paste

The surface of the green sheet is covered by screen printing with Cu metalizing paste, which forms a Cu-metalized conductive layer on sintering. Various compositions and materials are available as the Cu metalizing paste. A typical example of the composition includes: 80 parts by weight of CuO (average grain size: 1 micrometer); 20 parts by weight of CuO (average grain size: 3 micrometer); 1 part by weight of $Bi_2O_3$ (0.7 micrometer); 0.5 part by weight of $Cr_2O_3$ (0.5 micrometer); 0.5 part by weight of Ag (3 micrometer); 1 part by weight of glass (4 micrometer); 5 parts by weight of resin or binder; and an adequate amount of solvent.

Step IV: Laminating Sheets

Plural green sheets with metalizing paste printed thereon are laminated in the predetermined order, exposed to heat and pressured for uniting, and cut to a predetermined shape and size.

Although only the plural green sheets are laminated in the embodiment, an insulating layer or a conductive layer may also be formed by printing.

Step V: Removal of Binder

The laminate is preliminarily fired in the atmosphere at approximately 300° C. for five hours, so that the binder or organic compound such as resin is removed from the green sheet and metalized layer. The sheet is further fired in the atmosphere at a temperature between 600° C. and 750° C. for one hour in order to completely remove the remaining carbon.

Step VI: Reduction Firing

Copper (II) oxide is reduced to copper in an atmosphere of ammonia decomposition gas or hydrogen gas at a temperature between 350° C. and 750° C.

Step VII: Final Firing

The laminate is then fired in a neutral atmosphere of non-oxidative as at a temperature between 900° and 1,110° C., so that the ceramics and metalized layer are sintered together.

As described above, adequate amounts of $Bi_2O_3$, $MoO_3$, and $Cr_2O_3$ are added to the composition for metalizing the ceramics. These additives effectively prevent occurrence of cracks in the metalized layer even in the event of volume variation from the conversion of CuO to Cu in the reduction firing step. Since this effect results in prevention of local sintering, the metalized layer obtained has improved conductivity and hermeticity. The composition of the embodiment does not include a higher ratio of copper and thus if prevents burring of the metalized layer.

Some experiments were conducted to show the improved properties of the metalized layer according to the invention.

Experiment 1

Table 1 shows the compositions of examples according to the invention and references with no additives. A 15 mm square ceramic package 4 shown in FIGS. 2A and 2B was prepared to include a metalized layer 3 between ceramic plates 1 and 2. Metalizing paste containing one of $Bi_2O_3$, $MoO_3$, and $Cr_2O_3$ was used to form the metalized layer 3. The metalized layer 3 thus obtained was checked for hermeticity and occurrence of cracks, and the results are shown in Table 1.

The amount of each additive is expressed as the percent by weight with respect to the CuO-Cu mixture or $CuO$-$CuO_2$ mixture in Table 1 as well as Tables 2–4, and 6.

Figure 2A:
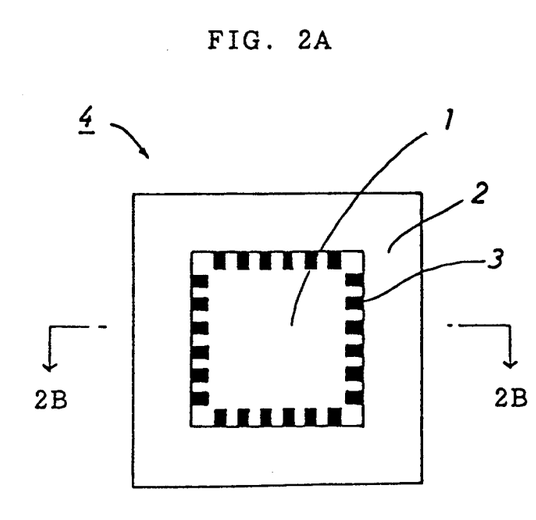
FIG. 2A is a plan view illustrating a ceramic package used in the test of the hermeticity.
Figure 2B:
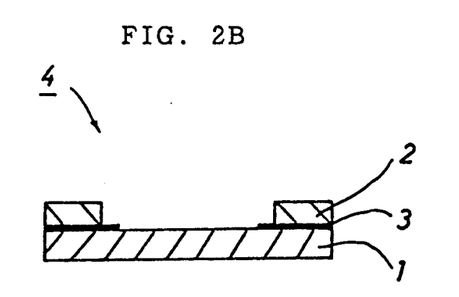
FIG. 2B is a cross sectional view illustrating the ceramic package of FIG. 2A.

The hermeticity was measured by utilizing the pressure difference between the center and periphery of the ceramic package 4. In Table 1, G (representing "good") denotes the amount of helium gas not greater than $3 \times 10^{-8}$ std.cc/sec and P (representing "poor") shows the greater amount, permeating through the volume of the metalized layer 3. P (representing "poor") shows occurrence of combined cracks of 10 micrometer each in diameter, F (representing "fair") shows observation of partial cracks, and G (representing "good") means substantially no cracks observed.

TABLE 1

| PASTE (SAMPLE) NUMBER | | PRIMARY INGREDIENTS | | | ADDITIVES | | | RESULTS | |
|---|---|---|---|---|---|---|---|---|---|
| | | CuO (3 μm) | CuO (1 μm) | $Cu_2O$ (3 μm) | $Cr_2O_3$ | $MoO_3$ | $Bi_2O_3$ | CRACKS | HERMETICITY |
| EXAMPLES | 1-1 | — | 100 | — | — | — | 3 | F | G |
| | 2 | — | 100 | — | — | 3 | — | G | P |
| | 3 | — | 100 | — | 1 | — | — | F | P |
| | 4 | 100 | — | — | — | — | 3 | G | P |
| | 5 | — | 100 | — | — | 1 | — | F | P |
| | 6 | 30 | 70 | — | — | — | 3 | F | P |
| | 7 | 30 | 70 | — | — | 3 | — | F | P |
| | 8 | 30 | 70 | — | 5 | — | — | G | P |
| REFERENCES | 9 | — | 100 | — | — | — | — | P | P |
| | 10 | 100 | — | — | — | — | — | F | P |
| | 11 | — | — | 100 | — | — | — | P | P |
| | 12 | 30 | 70 | — | — | — | — | P | P |

As clearly shown in Table 1, only partial or substantially no cracks were observed in the samples No. 1-1 to No. 1-8, which contained $Bi_2O_3$, $MoO_3$, or $Cr_2O_3$. On the contrary, combined cracks occurred in samples No. 1-9 to No. 1-12 which had no additives. In sample No. 1-10, cracks were observed partially but in a rather large number, and the metalized layer obtained was not densely packed but was porous.

Experiment 2

The combination of two or more additives was added to the primary mixture of CuO having different average grain sizes. The metalized layer obtained was checked for occurrence of cracks and hermeticity in the same manner as the experiment 1, and the results are shown in Table 2.

TABLE 2

| PASTE (SAMPLE) NUMBER | | PRIMARY INGREDIENTS | | ADDITIVES | | | | | RESULTS | |
|---|---|---|---|---|---|---|---|---|---|---|
| | | CuO (3 μm) | CuO (1 μm) | $Cr_2O_3$ | $MoO_3$ | $Bi_2O_3$ | Ag | GLASS | CRACKS | HERMETICITY |
| 2-1 | | 20 | 80 | 0.5 | — | 1 | 0.5 | — | G | G |
| 2 | | 20 | 80 | — | — | 1 | — | 1 | F | G |
| 3 | | 20 | 80 | 0.25 | — | 1 | — | 1 | F | G |
| 4 | | 20 | 80 | 0.5 | — | 1 | 0.5 | 1 | G | G |
| 5 | | 20 | 80 | 0.5 | — | 1 | 0.5 | 5 | G | G |
| 6 | | 20 | 80 | 0.5 | — | 1 | 0.5 | 3 | G | G |
| 7 | | 20 | 80 | 0.5 | 0.5 | — | — | 5 | G | G |
| 8 | | 20 | 80 | 0.5 | 3 | — | — | — | G | G |
| 9 | | 20 | 80 | 0.5 | 1 | — | — | — | F | G |
| 10 | | 20 | 80 | 0.5 | 0.5 | — | — | — | F | G |
| 11 | | 20 | 80 | 0.5 | 1 | 0.5 | — | — | G | G |
| 12 | | 20 | 80 | 0.5 | 0.5 | 0.5 | — | 5 | G | G |
| 13 | | 20 | 80 | 0.5 | 0.5 | 0.5 | — | — | F | G |

As clearly shown in Table 2, the composition containing the combination of two or more additives effectively prevents occurrence of cracks and improves the hermeticity, thus forming a metalized layer with excellent properties.

Experiment 3

The combination of two or more additives was added to the primary mixture of $CuO$-$Cu_2O$ having different average grain sizes. The metalized layer obtained was checked for occurrence of cracks and hermeticity in the same manner as the experiment 1, and the results are shown in Table 3.

TABLE 3

| PASTE (SAMPLE) NUMBER | PRIMARY INGREDIENTS | | | ADDITIVES | | | | RESULTS | |
|---|---|---|---|---|---|---|---|---|---|
| | CuO (3 μm) | CuO (1 μm) | $Cu_2O$ (1 μm) | $Cr_2O_3$ | $MoO_3$ | $Bi_2O_3$ | GLASS | CRACKS | HERMETICITY |
| 3-1 | — | 70 | 30 | — | 1.5 | 1.5 | — | F | G |

TABLE 3-continued

| PASTE (SAMPLE) NUMBER | PRIMARY INGREDIENTS | | | ADDITIVES | | | | RESULTS | |
|---|---|---|---|---|---|---|---|---|---|
| | CuO (3 μm) | CuO (1 μm) | $Cu_2O$ (1 μm) | $Cr_2O_3$ | $MoO_3$ | $Bi_2O_3$ | GLASS | CRACKS | HERMETI-CITY |
| 2 | — | 50 | 50 | — | 1.5 | 1.5 | — | G | G |
| 3 | — | 30 | 70 | — | 1.5 | 1.5 | — | G | G |
| 4 | — | 80 | 20 | 0.5 | — | 1 | — | F | P |
| 5 | 20 | — | 80 | 0.5 | — | 1 | — | G | P |
| 6 | 20 | — | 80 | 0.5 | — | 1 | 1 | G | G |
| 7 | 20 | — | 80 | 0.5 | 0.5 | — | 5 | G | G |
| 8 | 20 | — | 80 | 0.5 | 1 | — | — | G | G |
| 9 | 20 | — | 80 | 0.5 | 0.5 | — | — | G | G |

As clearly shown in Table 3, the composition containing $CuO$-$Cu_2O$ as the primary mixture and the combination of two or more additives efficiently prevents occurrence of cracks and improves the hermeticity in many cases, thus forming a metalized layer with excellent properties. Comparison between the samples No. 3-5 and No. 3-6 shows that addition of glass improves the hermeticity.

Experiment 4

The combination of two or more additives was added to the primary mixture of CuO-Cu having different average grain sizes. The metalized layer obtained was checked for occurrence of cracks and hermeticity in the same manner as the experiment 1, and the results are shown in Table 4.

TABLE 4

| PASTE (SAMPLE) NUMBER | PRIMARY INGREDIENTS | | | | ADDITIVES | | | RESULTS | |
|---|---|---|---|---|---|---|---|---|---|
| | CuO (3 μm) | CuO (1 μm) | Cu (3.5 μm) | Cu (15 μm) | $Cr_2O_3$ | $MoO_3$ | $Bi_2O_3$ | CRACKS | HERMETI-CITY |
| 4-1 | 80 | 5 | 5 | 10 | 0.5 | 1 | — | F | G |
| 2 | 80 | 5 | 5 | 10 | — | 1 | 1 | F | G |
| 3 | 80 | 5 | 5 | 10 | 0.5 | — | 1 | G | G |
| 4 | 80 | — | — | 20 | 0.5 | 1 | — | F | G |
| 5 | 80 | — | — | 20 | — | 1 | 1 | G | G |
| 6 | 80 | — | — | 20 | 0.5 | — | 1 | G | G |
| 7 | 90 | — | — | 10 | 0.5 | 1 | — | G | G |
| 8 | 90 | — | — | 10 | — | 1 | 1 | G | G |
| 9 | 90 | — | — | 10 | 0.5 | — | 1 | G | G |

As clearly shown in Table 4, the composition containing CuO-Cu as the primary mixture and the combination of two or more additives efficiently prevents occurrence of cracks and improves the hermeticity, thus forming a metalized layer with excellent properties.

Experiment 5

Figure 3:
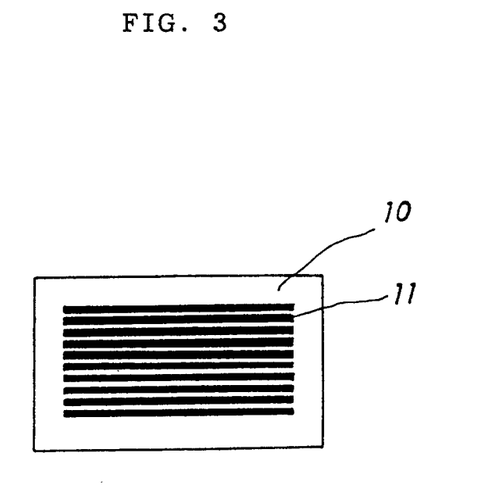
FIG. 3 is a plan view showing a substrate used in the test of the adhesion strength.

A metalized pattern 11 (width: 0.7mm: length: 25mm) was formed on the surface of a ceramic substrate 10 as shown in FIG. 3 by using paste of the example No. 2-1, No. 2-6, No. 3-2, or No. 3-7 or the reference No. 1-9. The conductive resistance or volume resistance ($\mu\Omega$·cm) was measured between both ends of the pattern 11. A copper wire of 0.5 mm in diameter was soldered in the 1.6 mm square pattern, and was pulled in the vertical direction to measure the adhesion strength (kg/mm$^2$). The results are shown in Table 5.

TABLE 5

| | PASTE (SAMPLE) NUMBER | VOLUME RESISTIVITY ($\mu\Omega$·cm) | ADHESION STRENGTH (kg/mm$^2$) |
|---|---|---|---|
| EXAMPLES | 2-1 | 4.74 | 0.6 |
| | 2-6 | 8.44 | 0.5 |
| | 3-2 | 5.67 | 0.3 |
| | 3-7 | 6.46 | 0.3 |
| REFERENCES | 1-9 | WIRE BROKEN | 0.2 |

As clearly shown in Table 5, the composition of the example has small volume resistance and high adhesion strength, thus forming a metalized layer with excellent properties, while the reference with no additives had low adhesion strength and caused wire breaking.

Experiment 6

The effect of silver and glass added to the composition was tested in experiment 6. The combination of two or more additives as well as silver and glass were added to the primary mixture of CuO having different average grain sizes. The metalized layer obtained was checked for occurrence of cracks and hermeticity in the same manner as experiment 1. The results are shown in Table 6. Here, samples No. 2-1, No. 2-4, No. 2-5, and No. 2-6 are examples according to the invention, and the sample No. 2-14 is a reference.

The volume resistance and adhesion strength were also measured in the same manner as experiment 5. The results are shown in Table 7. Here, the sample No. 2-1, which did not include glass, was used as the reference to show the effect of glass addition.

TABLE 6

|  | PASTE (SAMPLE) NUMBER | PRIMARY INGREDIENTS | | ADDITIVES | | | | RESULTS | |
|---|---|---|---|---|---|---|---|---|---|
|  |  | CuO (3 μm) | CuO (1 μm) | $Cr_2O_3$ | $MoO_3$ | Ag | GLASS | CRACKS | HERMETI-CITY |
| EXAMPLES | 2-1 | 20 | 80 | 0.5 | 1 | 0.5 | — | G | G |
|  | 4 | 20 | 80 | 0.5 | 1 | 0.5 | 1 | G | G |
|  | 5 | 20 | 80 | 0.5 | 1 | 0.5 | 3 | G | G |
|  | 6 | 20 | 80 | 0.5 | 1 | 0.5 | 5 | G | G |
| REFERENCES | 2-14 | 20 | 80 | 0.5 | 1 | — | — | G | P |

TABLE 7

|  | PASTE (SAMPLE) NUMBER | VOLUME RESISTIVITY ($\mu \Omega \cdot cm$) | ADHESION STRENGTH ($kg/mm^2$) |
|---|---|---|---|
| EXAMPLES | 2-5 | 6.44 | 0.7 |
| REFERENCES | 2-1 | 4.60 | 0.6 |

As clearly shown in Tables 6 and 7, addition of silver and glass further enhances hermeticity. Glass especially increases the adhesion strength without causing wire breaking.

This invention may be embodied in several forms without departing from the spirit of the essential characteristics of the invention. The embodiment above is therefore only illustrative and not restrictive in any sense.

As described above, the composition for metalizing ceramics according to the invention includes adequate amounts of $Bi_2O_3$, $MoO_3$, or $Cr_2O_3$. These additives effectively keep the metalized layer out of cracks in the reduction firing step, thus preventing local sintering in the final firing step. The metalized layer obtained has favorable conductivity and hermeticity, and is thereby useful in the manufacture of multi-layered wiring substrates and various packages with fine pattern and higher wiring density. The composition of the invention does not include a higher ratio of copper and thus effectively prevents burring of the metalized layer.

An adequate amount of silver attain a more densely packed metalized layer, and an appropriate volume of glass improves both hermeticity and adhesion strength.

What is claimed is:

1. A composition for metalizing low temperature-fired ceramics, comprising: a primary mixture of copper Cu and copper (II) oxide CuO; and a combination including at least two oxides selected from the group consisting of bismuth (III) oxide ($Bi_2O_3$), molybdenum (VI) oxide ($MoO_3$), and chromium (III) oxide ($Cr_2O_3$).

2. A composition in accordance with claim 1, in which $Bi_2O_3$ is present in the range of 1 to 8 percent by weight, $MoO_3$ is present in the range of 0.1 to 2 percent by weight, and $Cr_2O_3$ is present in the range of 0.1 to 2 percent by weight with respect to said primary mixture.

3. A composition in accordance with claim 1, further comprising 0.1 to 0.5 percent by weight of silver (Ag) with respect to said primary mixture.

4. A composition in accordance with claim 1, further comprising 1 to 10 percent by weight of glass with respect to the primary mixture.

5. A composition in accordance with claim 3, further comprising 1 to 10 percent by weight of glass with respect to the primary mixture.

6. A composition in accordance with claim 1, in which the mixture of said primary mixture comprises thirty to a hundred parts by weight of copper (II) oxide powder and copper powder in an amount of up to seventy parts by weight.

7. A composition in accordance with claim 1, the range of the grain size is 0.5 to 5 micrometers in diameter for copper (II) oxide and 0.5 to 20 micrometers in diameter for copper.

8. A composition for metalizing low temperature-fired ceramics, comprising: a primary mixture of copper (II) oxide (CuO) and copper (I) oxide ($Cu_2O$); and a combination including at least two oxides selected from the group consisting of bismuth (III) oxide ($Bi_2O_3$), molybdenum (VI) oxide ($MoO_3$), and chromium (III) oxide ($Cr_2O_3$).

9. A composition in accordance with claim 8, in which $Bi_2O_3$ is present in the range of 1 to 8 percent by weight, $MoO_3$ is present in the range of 0.1 to 5 percent by weight, and $Cr_2O_3$ is present in the range of 0.1 to 2 percent by weight with respect to said primary mixture.

10. A composition in accordance with claim 8, further comprising 0.1 to 0.5 percent by weight of silver (Ag) and 1 to 10 percent by weight of glass with respect to the primary mixture.

11. A composition in accordance with claim 8, further comprising 1 to 10 percent by weight of glass with respect to the primary mixture.

12. A composition in accordance with claim 8, in which the mixture of the primary mixture comprises ten to a hundred parts by weight of copper (II) oxide and copper (I) oxide in an amount of up to ninety parts by weight.

13. A composition in accordance with claim 8, the range of the grain size is 0.5 to 5 micrometers in diameter for copper (II) oxide and 0.5 to 10 micrometers for copper (I) oxide.

14. A composition for metalizing low temperature-fired ceramics, comprising: mixture of copper Cu and copper(II) oxide CuO as a primary mixture; and 0.1 to 5 percent by weight of molybdenum(VI) oxide, $MoO_3$ or 0.1 to 2 percent by weight of chromium(III) oxide, $Cr_2O_3$.

15. A composition in accordance with claim 14, further comprising 0.1 to 0.5 percent by weight of silver (Ag) and 1 to 10 percent by weight of glass with respect to the primary mixture.

16. A composition in accordance with claim 14, further comprising 1 to 10 percent by weight of glass with respect to the primary mixture.

17. A composition in accordance with claim 14, in which the mixture of the primary mixture comprises thirty to a hundred parts by weight of copper (II) oxide powder and copper powder in an amount of up to seventy parts by weight.

18. A composition in accordance with claim 14, the range of the grain size is 0.5 to 5 micrometers in diameter for copper (II) oxide and 0.5 to 20 micrometers for copper.

19. A composition for metalizing low temperature-fired ceramics, comprising: a primary mixture of copper(II) oxide CuO and copper(I) oxide $Cu_2O$; and 0.1 to 5 percent by weight of molybdenum(VI) oxide, ($MoO_3$) or 0.1 to 2 percent by weight of chromium(III) oxide, $Cr_2O_3$.

20. A composition in accordance with claim 19 further comprising 0.1 to 0.5 percent by weight of silver (Ag) and 1 to 10 percent by weight of glass with respect to the primary mixture.

21. A composition in accordance with claim 19, in which the mixture of the primary mixture comprises ten to a hundred parts by weight of copper (II) oxide and copper (I) oxide in an amount of up to ninety parts by weight.

22. A composition in accordance with claim 19, the range of the grain size is 0.5 to 5 micrometers in diameter for copper (II) oxide and 0.5 to 10 micrometers for copper (I) oxide.

23. A composition in accordance with claim 19, further comprising 1 to 10 percent by weight of glass with respect to the primary mixture.

24. A composition for metalizing low temperature-fired ceramics, comprising mainly CuO and a combination including at least two oxides selected from the group consisting bismuth (III) oxide ($Bi_2$), molybdenum (VI) oxide ($MoO_3$), and chromium (III) oxide ($Cr_2O_3$).

* * * * *